United States Patent
Gale et al.

(10) Patent No.: US 9,753,093 B2
(45) Date of Patent: Sep. 5, 2017

(54) VEHICLE AND METHOD OF DIAGNOSING BATTERY CONDITION OF SAME

(75) Inventors: Allan Roy Gale, Livonia, MI (US); Bruce Carvell Blakemore, Plymouth, MI (US); Michael W. Degner, Novi, MI (US); Paul Theodore Momcilovich, Carleton, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 952 days.

(21) Appl. No.: 12/721,605

(22) Filed: Mar. 11, 2010

(65) Prior Publication Data

US 2011/0221392 A1    Sep. 15, 2011

(51) Int. Cl.
*H02J 7/00* (2006.01)
*G01R 31/36* (2006.01)
*B60L 11/18* (2006.01)

(52) U.S. Cl.
CPC ...... *G01R 31/3662* (2013.01); *B60L 11/1816* (2013.01); *B60L 11/1851* (2013.01); *B60L 11/1857* (2013.01); *B60L 11/1875* (2013.01); *G01R 31/3679* (2013.01); *B60L 2240/545* (2013.01); *B60L 2240/547* (2013.01); *B60L 2240/549* (2013.01); *B60L 2240/80* (2013.01); *B60L 2250/16* (2013.01); *Y02T 10/7005* (2013.01); *Y02T 10/705* (2013.01); *Y02T 10/7072* (2013.01); *Y02T 90/14* (2013.01)

(58) Field of Classification Search
CPC ............ G01R 31/3648; G01R 31/3679; G01R 31/3662; B60L 11/1816; B60L 11/1851; B60L 11/1857; B60L 11/1875; B60L 2240/545; B60L 2240/547; B60L 2240/549; B60L 2240/80; B60L 2250/16; B60L 11/1809
USPC ................................ 324/427, 430; 320/145
See application file for complete search history.

(56) References Cited

U.S. PATENT DOCUMENTS

| 3,857,087 A | * | 12/1974 | Jones ........................... 320/130 |
| 4,745,349 A | | 5/1988 | Palanisamy et al. |
| 5,193,067 A | | 3/1993 | Sato et al. |
| 5,196,780 A | | 3/1993 | Pacholok |

(Continued)

FOREIGN PATENT DOCUMENTS

| EP | 1180692 A1 | 2/2002 |
| JP | 2000190793 A | 7/2000 |

(Continued)

OTHER PUBLICATIONS

Y. Konya, et al., A Deterioration Estimating System for 200-Ah Sealed Lead-Acid Batteries, downloaded on Mar. 25, 2009 from IEEE Explore.

(Continued)

*Primary Examiner* — Nathaniel Pelton
(74) *Attorney, Agent, or Firm* — David B. Kelley; Brooks Kushman P.C.

(57) ABSTRACT

A method for diagnosing a battery may include applying a generally constant current to the battery for a period of time, measuring a response voltage of the battery to the applied current, determining battery impedance parameters based on at least one of the applied current, period of time, and response voltage, and determining a degradation condition of the battery based on the battery impedance parameters.

5 Claims, 3 Drawing Sheets

(56) References Cited

U.S. PATENT DOCUMENTS

| | | | |
|---|---|---|---|
| 5,281,919 A | | 1/1994 | Palanisamy |
| 5,757,192 A | | 5/1998 | McShane et al. |
| 5,895,440 A | * | 4/1999 | Proctor et al. ............ 702/63 |
| 6,057,671 A | | 5/2000 | Kuno |
| 6,094,033 A | * | 7/2000 | Ding et al. ............ 320/132 |
| 6,211,681 B1 | | 4/2001 | Kagawa et al. |
| 6,262,577 B1 | * | 7/2001 | Nakao et al. ............ 324/425 |
| 6,424,157 B1 | | 7/2002 | Gollomp et al. |
| 6,476,585 B1 | | 11/2002 | Simmonds |
| 6,788,069 B2 | * | 9/2004 | Vacher ............ 324/430 |
| 6,983,212 B2 | | 1/2006 | Burns |
| 7,269,535 B2 | | 9/2007 | Kishimoto |
| 7,317,299 B2 | | 1/2008 | Koo |
| 7,545,109 B2 | * | 6/2009 | Salman et al. ............ 318/139 |
| 7,880,597 B2 | * | 2/2011 | Uchida ............ 340/439 |
| 2006/0132096 A1 | | 6/2006 | Maleus |
| 2006/0152168 A1 | | 7/2006 | O'Gorman et al. |
| 2007/0080006 A1 | | 4/2007 | Yamaguchi |
| 2007/0159177 A1 | | 7/2007 | Bertness et al. |
| 2007/0236225 A1 | * | 10/2007 | Tsenter et al. ............ 324/426 |
| 2008/0150457 A1 | * | 6/2008 | Salman et al. ............ 318/139 |
| 2008/0231284 A1 | * | 9/2008 | Birke et al. ............ 324/426 |
| 2008/0238361 A1 | | 10/2008 | Pinnell et al. |
| 2009/0040033 A1 | * | 2/2009 | Uchida ............ 340/439 |
| 2009/0207664 A1 | | 8/2009 | Kim et al. |
| 2010/0007481 A1 | * | 1/2010 | Uchida ............ 340/455 |
| 2010/0019729 A1 | * | 1/2010 | Kaita ............ B60L 11/123 320/134 |
| 2010/0327818 A1 | | 12/2010 | Taniguchi et al. |
| 2011/0077879 A1 | * | 3/2011 | Paryani ............ 702/63 |

FOREIGN PATENT DOCUMENTS

| | | |
|---|---|---|
| WO | 9201502 A1 | 2/1992 |
| WO | 9215022 A1 | 9/1992 |
| WO | 2007055101 A1 | 5/2007 |

OTHER PUBLICATIONS

M.S. Duvall, Battery Evaluation for plug-in hybrid electric vehicles, printed from IEEE Explore on Oct. 13, 2008.

Electric Transportation Applications, EV America: Hybrid Electric Behicle (HEV) Technical Specifications, effective Nov. 1, 2004.

* cited by examiner

VEHICLE AND METHOD OF DIAGNOSING BATTERY CONDITION OF SAME

BACKGROUND

Plug-in hybrid electric vehicles may include a high voltage traction battery and a low voltage auxiliary battery. Each of the batteries may be charged with energy from an electrical grid.

SUMMARY

A generally constant current may be applied to a battery for a period of time. A response voltage of the battery to the applied current may be measured. Battery impedance parameters may be determined based on at least one of the applied current, period of time, and response voltage. A condition of the battery may be determined based on the battery impedance parameters.

While example embodiments in accordance with the invention are illustrated and disclosed, such disclosure should not be construed to limit the invention. It is anticipated that various modifications and alternative designs may be made without departing from the scope of the invention.

DETAILED DESCRIPTION

Figure 1:
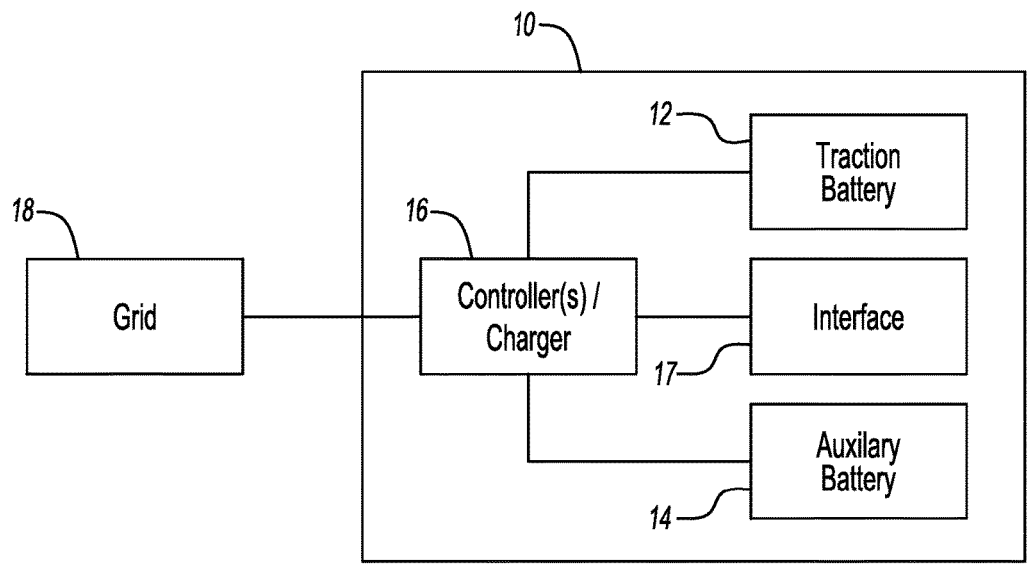
FIG. 1 is a block diagram of an embodiment of an alternatively powered vehicle.

Referring to FIG. 1, a vehicle 10 may include a traction battery 12, low voltage auxiliary battery 14, control module(s) and/or battery charger 16, and driver interface 17 (e.g., display screen/panel, speaker system, etc.) As known in the art, the traction battery 12 may be arranged to provide energy to move the vehicle 10; the auxiliary battery 14 may be arranged to provide energy to auxiliary loads such as lighting, etc.

The vehicle 10, in the embodiment of FIG. 1, is a plug-in hybrid electric vehicle (PHEV). (Other vehicle configurations such as battery electric, etc., however, are also contemplated.) The controller/charger 16, therefore, may be electrically connected with a power grid 18 (e.g., it may be plugged-in to a wall outlet) and permit energy to flow from the grid 18 to either of the batteries 12, 14 to charge the batteries 12, 14.

An auxiliary battery may be charged to a fixed voltage or a voltage that is a function of ambient temperature. If an auxiliary battery contains a cell with relatively low capacity (due to aging) or a cell that is shorted, an attempt to charge the battery to a fixed voltage may result in an overcharge condition of the low capacity cell or an overcharge condition of non-shorted cells. Overcharging can result in cell heating and release of hydrogen (gassing), which may adversely affect the auxiliary battery.

In a vehicle powered by an internal combustion engine, cell heating and/or gassing may be of little concern as the auxiliary battery is charged during driving. The effects of cell heating and/or gassing may be mitigated by the airflow experienced during driving. Additionally, because the auxiliary battery provides energy to start the engine, a weak or shorted cell is likely to result in poor or no engine starting. The auxiliary battery will likely be replaced before the heating or gassing condition occurs.

In alternatively powered vehicles, such as the PHEV 10, the auxiliary battery 14 does not provide starting energy. It may thus continue to be operated with a weak or shorted cell. Also, the power line from the grid 18 may have a limited amount of power it can provide to the controller/charger 16. Excessive charging of the auxiliary battery 14 can increase the amount of time (and cost) it takes to complete a vehicle charge.

An auxiliary battery may be found to be "good" or "bad" by connecting a relatively small resistance (e.g., 50 mΩ) across its terminals to draw a rather large load current. Under these circumstances, the voltage of a "good" 12 V battery, for example, may drop to 9 V while the voltage of a "bad" 12 V battery may drop to 4 V. This technique, however, cannot be performed during battery charge and may not reveal why the battery is "bad."

Certain embodiments disclosed herein may assess a condition of the auxiliary battery 14 during charge, select a charge voltage and maximum current based on the condition, select a set point voltage and current based on the condition, and/or notify a vehicle operator of the condition and/or selections. The age and/or state of plate deterioration, for example, may be assessed based on the behavior of cell voltages when the auxiliary battery 14 is exposed to certain charge profiles. Once the condition of the auxiliary battery 14 is determined, the charge and operating profiles may be tailored to the specific conditions detected. A driver may also be informed, via the interface 17, as to the condition of the auxiliary battery 14 (e.g., age), the capability of the auxiliary battery 14 to hold charge, whether the auxiliary battery 14 has a bad cell, whether a modified charge profile has been implemented, whether a new battery is needed, etc. Other scenarios are also possible.

Figure 2:
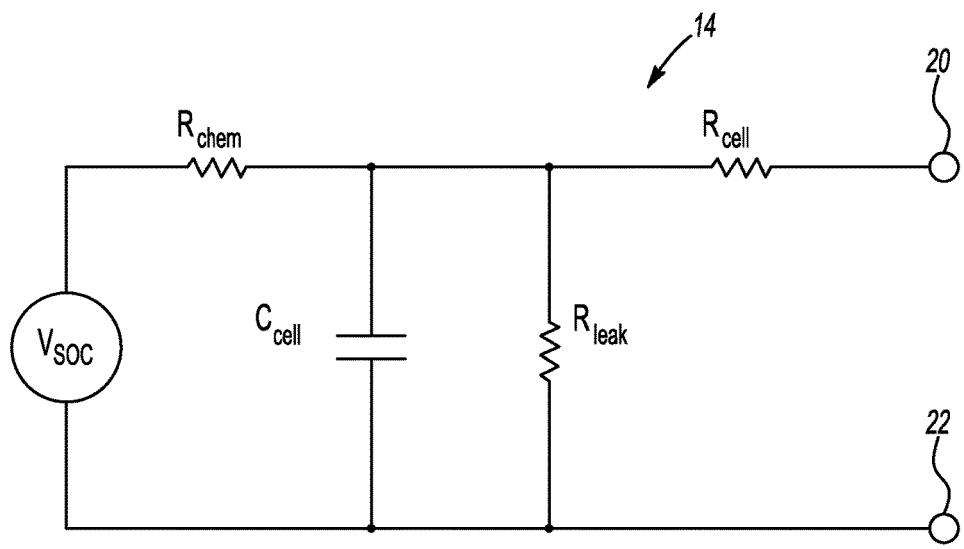
FIG. 2 is a schematic diagram of an equivalent circuit representing cells of the auxiliary battery of FIG. 1.

Referring to FIGS. 1 and 2, an equivalent circuit representation of the auxiliary battery 14 includes a state of charge (SOC) dependent voltage source, $V_{SOC}$, a cell capacitance, $C_{cell}$, incorporating both electrical and active material activation energy requirements, a chemical process resistance, $R_{chem}$, a cell resistance, $R_{cell}$, a leakage resistance, $R_{leak}$, and terminals 20, 22. Pulses of generally constant current from the controller/charger 16, $i_{chg}$, may be applied to the terminals 20, 22.

When the controller/charger 16 applies $i_{chg}$ to the terminals 20, 22, $C_{cell}$ will begin to acquire charge (until the activation energy component of $C_{cell}$ is met, however, little energy will flow through $R_{chem}$ and $R_{leak}$). Its voltage will thus change according to the equation $$v_{SOC}(t) = \frac{1}{C_{cell}} \int \left(i_{chg} - \frac{V_{SOC}}{R_{leak}}\right) dt + i_{chg} * R_{cell} + V_{SOC}(0) \qquad (1)$$

When $C_{cell}$ is charged, energy will flow through $R_{chem}$ for storage in $V_{SOC}$. The change in $V_{SOC}$ during charge is proportional to the ratio of added energy stored in the auxiliary battery 14 to its total energy storage capability. In addition, the change in $V_{SOC}$ is small compared to the total value of $V_{SOC}$, resulting in the change in $V_{SOC}$ being a linear representation of A–hrs stored during the charge. The equation for $v_{SOC}(t)$ during this storage phase is $$v_{SOC}(t) = i_{chg} * (R_{cell} + R_{chem}) + V_{SOC}(0) \qquad (2)$$

When the charge is stopped, $i_{chg}=0$ and $C_{cell}$ will discharge into $V_{SOC}$ through $R_{chem}$ according to the equation $$v_{SOC}(t) = \frac{1}{C_{cell}} \int i_{cell} dt = i_{cell} * R_{chem} + V_{SOC} \quad (3)$$

where $i_{cell}$ is the current associated with $C_{cell}$.

The controller/charger 16 (or other suitable controller) may monitor the above described change in voltage. As explained below, this change in voltage along with other parameters may be used to assess the condition of the auxiliary battery 14.

Figure 3:
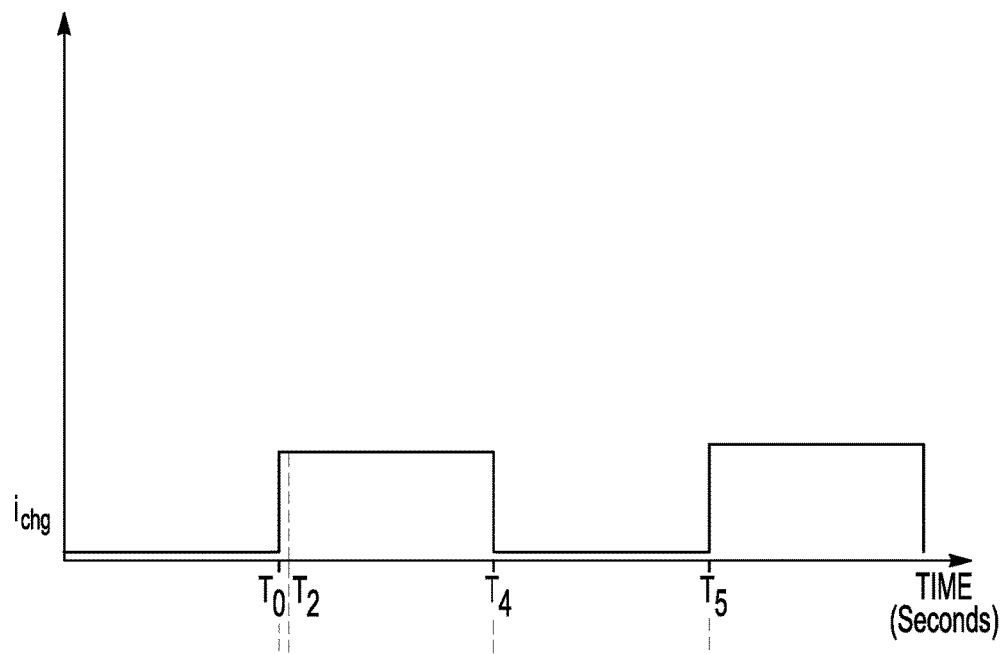
FIG. 3 is an example plot of charge current versus time.

Referring to FIGS. 1 and 3, the controller/charger 16 may apply one or more current pulses to the auxiliary battery 14 using known techniques, such as those described in U.S. Pat. No. 3,857,087 to Jones. For example, the duration of the pulses of FIG. 3 are sufficiently long (e.g., 30 sec.) such that $C_{cell}$ is able to charge and a small amount of energy is transferred into $V_{SOC}$. Each pulse is followed by a rest period sufficiently long (e.g., 30 sec.) such that $C_{cell}$ is able to discharge to the value of $V_{SOC}$. Other suitable profiles, however, may be used.

Figure 4:
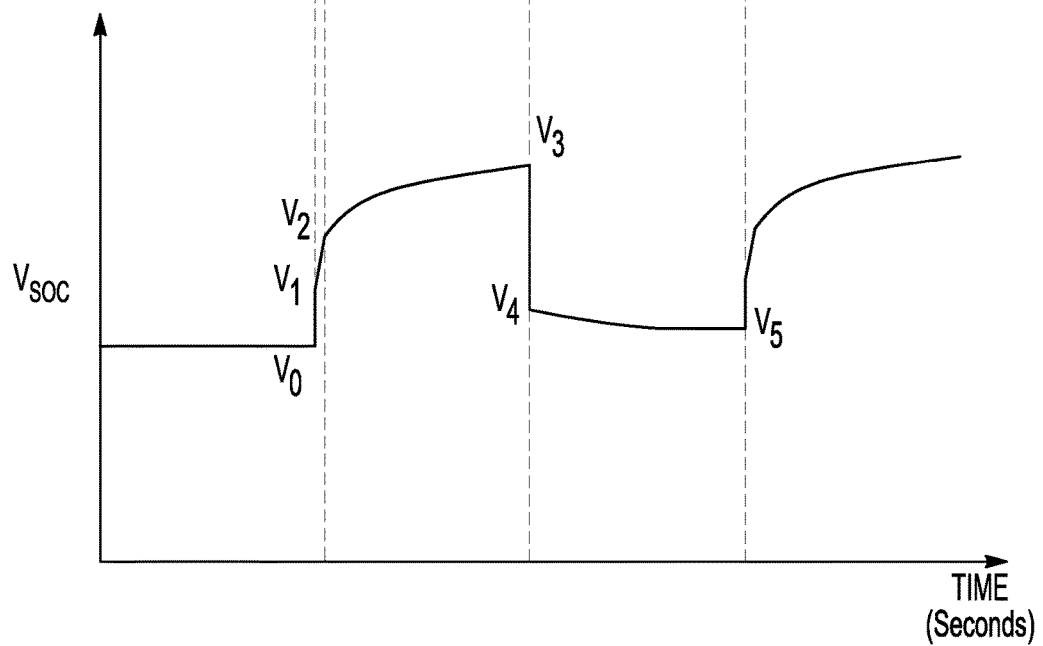
FIG. 4 is an example plot of cell voltage versus time.

Referring to FIGS. 3 and 4, the cell voltage, $v_{SOC}(t)$, changes according to (1), (2) and (3) as the current pulses are applied and removed. Several voltages of interest, $V_0$, $V_1$, $V_2$, $V_3$, $V_4$, $V_5$, are labeled. These voltages along with the charge current magnitude and duration may be used to determine the following impedance parameters:

$$R_{cell} = \frac{(V_1 - V_0)}{i_{chg}} \quad (4)$$

$$R_{chem} = \left(\frac{(V_3 - V_4)}{i_{chg@V_3}}\right) - R_{cell} \quad (5)$$

$C_{cell}$ can be determined from $R_{chem}$ and the rate of decay in voltage from $V_4$ to $V_5$. During this interval, (3) can be rewritten as $$V_{SOC} = (V_4 - V_5)*e^{-t/RC} + V_5 \quad (6)$$

or, $$C_{cell} = \frac{-t}{R_{chem} * \ln\left(\frac{V_{SOC} - V_5}{V_4 - V_5}\right)} \quad (7)$$

(Of course, $C_{cell}$ may also be calculated based on $V_1$ and $V_2$.) These impedance parameters change with the condition of the auxiliary battery 14 of FIG. 1 and may be used to determine how the auxiliary battery 14 should be charged as well as when it should be replaced.

A typical battery is rated in A–hrs for a charge/discharge cell voltage range. That is, $$A-hrs = \oint i_{chg} dt \quad (8)$$

The difference in A–hrs during a cell charge compared with a cell discharge is due to the electrical and electro-chemical parameters of the cell and will result in less A–hrs during discharge of a fixed A–hr charge due to the cell energy loss via $R_{cell}$ and $R_{chem}$. The ratio of A–hrs out to A–hrs in may be given by $$\text{Health\_Term\_1} = \frac{I_{chg} * \text{time}}{\frac{dV_{SOC}}{dt}} = \frac{I_{chg} * \text{time}_{(V_4-V_0)}}{V_5 - V_0} \quad (9)$$

The total A–hrs stored by the battery 14 may be given by $$\text{Health\_Term\_2} = \frac{A - hrs}{(V_5 - V_0) * K} \quad (10)$$

where K is a constant that may be determined via testing, etc.

Figure 5:
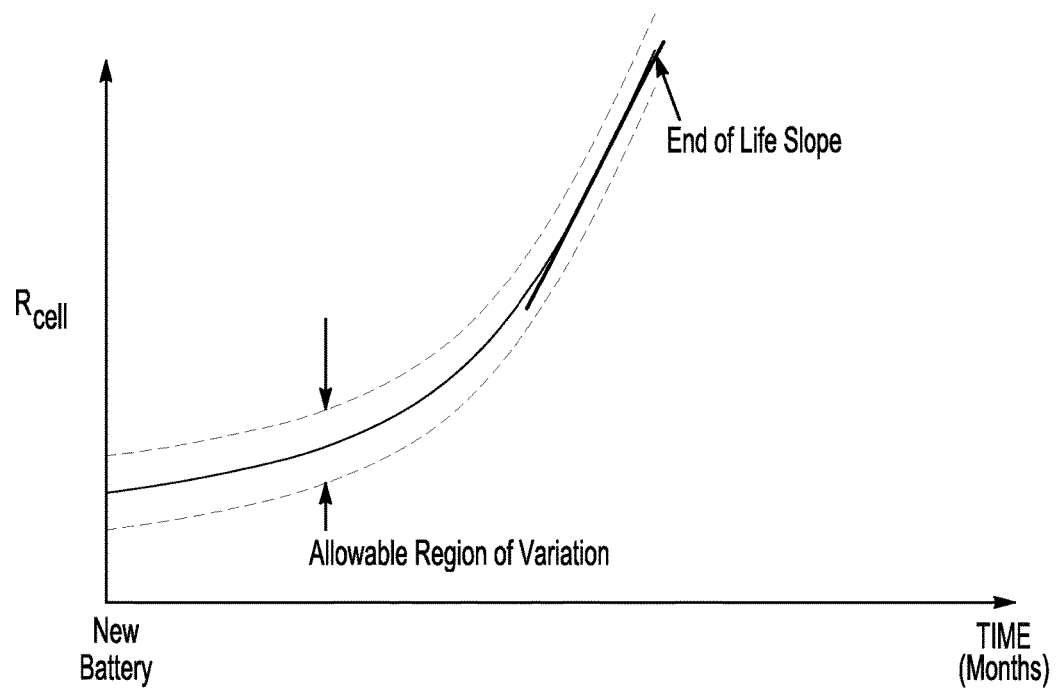
FIG. 5 is an example plot of cell resistance versus time.

Referring to FIGS. 1 and 5, the cell resistance, $R_{cell}$, of the auxiliary battery 14 is expected to increase as it ages. This information may be determined in any suitable fashion including testing, simulation, etc. The controller/charger 16 may store information related to such an expected aging curve and compare determined values of $R_{cell}$ against it to assess battery age/condition. For example, the controller/charger 16 may periodically (e.g., once each day) determine several $R_{cell}$ values using the algorithms described above. The controller/charger 16 may average these $R_{cell}$ values and place the average value along the aging curve according to the number of days that have passed since the battery was new (i.e., the first time the controller/charger 16 determined $R_{cell}$). As subsequent $R_{cell}$ values are determined, they may be stored and used to determine whether the auxiliary battery 14 is at its end of life as discussed below.

The rate of change of $R_{cell}$ over time (i.e., the slope of the curve illustrated in FIG. 5) becomes steeper as the auxiliary battery 14 approaches its end of life. A slope of at least a certain value may thus indicate that the auxiliary battery 14 is at its end of life. If the difference between a current value of $R_{cell}$ and a previously recorded value of $R_{cell}$ divided by the time passed between the two measurements is greater than a predetermined threshold (e.g., a slope that is 3 times greater than the slope around the new battery region), the controller/charger 16 may determine that the auxiliary battery 14 is at its end of life and needs to be replaced.

$R_{cell}$ values below the allowable variation region of the aging curve are indicative of a new battery. (The allowable variation region, for example, may represent ±5% of a mean value, and be determined via testing, simulation, etc.) In these circumstances, the controller/charger 16 may reinitialize/clear its record of any stored $R_{cell}$ values.

$R_{cell}$ values above the allowable variation region of the aging curve may be indicative of battery defects. In these circumstances, the controller/charger 16 may determine the likely cause of the battery defects and whether the auxiliary battery 14 is recoverable based on, for example, the values of the parameters from (7), (9) and (10).

The $C_{cell}$, Health_Term_1 and Health_Term_2 impedance parameters each have ranges of values that may be considered normal. That is, these parameters may be expected to take on values within these ranges under normal operating circumstances. Example normal ranges include, for $C_{cell}$, the new battery $C_{cell}$ value to 110% of that value, for Health_Term_1, 0.9 to 1.0, and for Health_Term_2, the new battery Health_Term_2 value to 60% of that value. Other ranges are also possible depending on the type of battery, etc.

Values less than the above ranges may be indicative of defect conditions (e.g., a shorted cell, battery dry out, a sulphated plate) as detailed in Table 1.

TABLE 1

|  | Shorted Cell | Dry Out | Sulphation |
|---|---|---|---|
| $C_{cell}$ | Normal | Low | Normal |
| Health_Term_1 | Low | Normal | Low |
| Health_Term_2 | Normal | Normal | Low |

The extent to which a parameter is "Low" may determine whether a defective battery is recoverable. As an example, if any of the parameters are 50% to 99% of their lower threshold normal values, the battery may be considered recoverable (through application of a proper charging profile as explained below). If any of the parameters are less than 50% of their lower threshold normal values, the battery may be considered unrecoverable. These recoverable/unrecoverable ranges depend on the type of battery and other design considerations. As a result, they may be determined based on testing, simulation, etc.

To extend the life of the auxiliary battery 14, the controller/charger 16 may tailor charging and/or operating profiles for the auxiliary battery 14 based on the above information. A charge profile may be defined by a charge voltage and maximum current. Absent any of the above battery diagnosis information (or under normal operating circumstances), the controller/charger 16 may select a default charge voltage and default maximum current at which to charge the auxiliary battery 14. These default values, however, may be altered based on battery age. For example, the default charge voltage may be increased based on the battery age. (Herein, age may be defined by the time that has passed, e.g., 389 days, from a "new battery" determination or age may be defined by the value of the slope of the aging curve, etc.) If, for example, the battery is 400 days old, the charge voltage may be increased by 10% relative to the default (or "new battery") charge voltage. Alternatively, if the current slope of the aging curve is 0.8, the charge voltage may be increased by 15% relative to the default charge voltage, etc. The optimum amount by which to alter the charge voltage may be determined via testing, simulation, etc.

The default charge parameters may also be altered based on whether the auxiliary battery 14 exhibits a defect as detailed in Table 2.

TABLE 2

|  | Shorted Cell | Dry Out | Sulphation |
|---|---|---|---|
| Charge Voltage | Decrease | Increase | Increase |
| Maximum Current | No Change | Decrease | No Change |

If, for example, the controller/charger 16 detects a shorted battery cell, the charge voltage may be decreased 10% relative to the "new battery" charge voltage. If, for example, the controller/charger 16 detects a dry out condition, the age adjusted charge voltage may be increased by 12% and the maximum current may be decreased by 18%. If, for example, the controller/charger 16 detects a plate sulphation condition, the age adjusted charge voltage may be increased by 10%. Again, the optimum amount by which to alter the charge voltage and/or maximum current may be determined via testing, simulation, etc.

An operating profile may be defined by a set point voltage and set point current. Absent any of the above battery diagnosis information (or under normal operating circumstances), the controller/charger 16 may select a default set point voltage and set point current at which to operate the battery 14. These default values, however, may be altered based on battery age. That is, the set points are a function of battery age. For example, the default set point voltage and default set point current may be increased based on the battery age. The optimum amount by which to alter the set points may be determined via testing, simulation, etc.

The default operating parameters may also be altered based on whether the auxiliary battery 14 exhibits a defect as detailed in Table 3.

TABLE 3

|  | Shorted Cell | Dry Out | Sulphation |
|---|---|---|---|
| Set Point Voltage | Decrease | Increase | Increase |
| Set Point Current | No Change | No Change | No Change |

If, for example, the controller/charger 16 detects a shorted cell, the set point voltage may be decreased by 6%. If, for example, the controller/charger 16 detects a dry out condition, the set point voltage may be increased by 5%. If, for example, the controller/charger 16 detects a plate sulphation condition, the set point voltage may be increased by 15%. Again, the optimum amount by which to alter the set points may be determined via testing, simulation, etc.

As apparent to those of ordinary skill, the algorithms disclosed herein may be deliverable to a processing device, which may include any existing electronic control unit or dedicated electronic control unit, in many forms including, but not limited to, information permanently stored on non-writable storage media such as ROM devices and information alterably stored on writeable storage media such as floppy disks, magnetic tapes, CDs, RAM devices, and other magnetic and optical media. The algorithms may also be implemented in a software executable object. Alternatively, the algorithms may be embodied in whole or in part using suitable hardware components, such as Application Specific Integrated Circuits (ASICs), state machines, controllers or other hardware components or devices, or a combination of hardware, software and firmware components.

While embodiments of the invention have been illustrated and described, it is not intended that these embodiments illustrate and describe all possible forms of the invention. The words used in the specification are words of description rather than limitation, and it is understood that various changes may be made without departing from the spirit and scope of the invention.

What is claimed:

1. A vehicle comprising:
   a battery disposed within the vehicle; and
   a battery charger disposed within the vehicle and configured to
   receive power from a wall outlet and transfer the power to the battery to charge the battery, and
   while operating to charge the battery, identify a degradation condition of the battery defined by a battery cell capacitance, that incorporates electrical and active material activation energy requirements, being less than a predefined range of capacitance values, a ratio of battery amp-hours out to battery amp-hours in falling within a predefined range of ratio values, and a total battery amp-hours stored falling within a predefined range of amp-hour values.

2. The vehicle of claim 1, wherein the degradation condition is a dry out condition.

3. A method comprising:
  while charging a battery, detecting a degradation of a battery responsive to a cell capacitance, that incorporates electrical and active material activation energy requirements, being below a predefined range of capacitance values, a ratio of battery amp-hours out to battery amp-hours in falling within a predefined range of ratio values, and a total battery amp-hours stored falling within a predefined range of amp-hour values; and
  altering the charging responsive to the detecting.

4. The method of claim 3, wherein altering the charging includes discontinuing the charging.

5. The method of claim 3, wherein altering the charging includes altering a charge voltage or maximum current associated with the charging.

\* \* \* \* \*